United States Patent
Kohyama

Patent Number: 6,140,673
Date of Patent: *Oct. 31, 2000

[54] SEMICONDUCTOR MEMORY DEVICE AND FABRICATING METHOD

[75] Inventor: Yusuke Kohyama, Yokosuka, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/963,193

[22] Filed: Nov. 3, 1997

Related U.S. Application Data

[63] Continuation of application No. 08/678,709, Jul. 11, 1996, abandoned.

[30] Foreign Application Priority Data

Jul. 13, 1995 [JP] Japan ................................. 7-176969

[51] Int. Cl.[7] .................................................. H01L 27/108
[52] U.S. Cl. ........................................... 257/301; 257/350
[58] Field of Search ................................... 257/301, 304, 257/347, 350, 382

[56] References Cited

U.S. PATENT DOCUMENTS

| | | | |
|---|---|---|---|
| 4,791,610 | 12/1988 | Takemae | 257/300 |
| 4,907,047 | 3/1990 | Kato et al. | 257/304 |
| 5,414,285 | 5/1995 | Nishihara | 257/350 |
| 5,442,211 | 8/1995 | Kita | 257/301 |
| 5,493,137 | 2/1996 | Satoh et al. | 257/304 |
| 5,495,439 | 2/1996 | Morihara | 257/350 |
| 5,770,876 | 6/1998 | Lam et al. | 257/301 |

FOREIGN PATENT DOCUMENTS

| | | | |
|---|---|---|---|
| 63-70560 | 3/1988 | Japan | 257/301 |
| 1-158768 | 6/1989 | Japan | 257/305 |

*Primary Examiner*—Mark V. Prenty
*Attorney, Agent, or Firm*—Banner & Witcoff, Ltd.

[57] ABSTRACT

In a high-integration DRAM device using a SOI substrate, a conductive film for connecting the source region or the drain region to the polysilicon film filled in the trench is formed in an etched-off portion of the insulating layer of the SOI substrate.

14 Claims, 4 Drawing Sheets

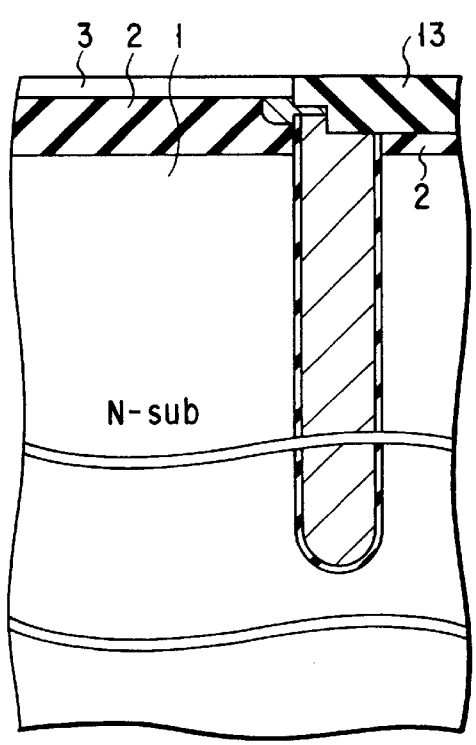
F I G. 7
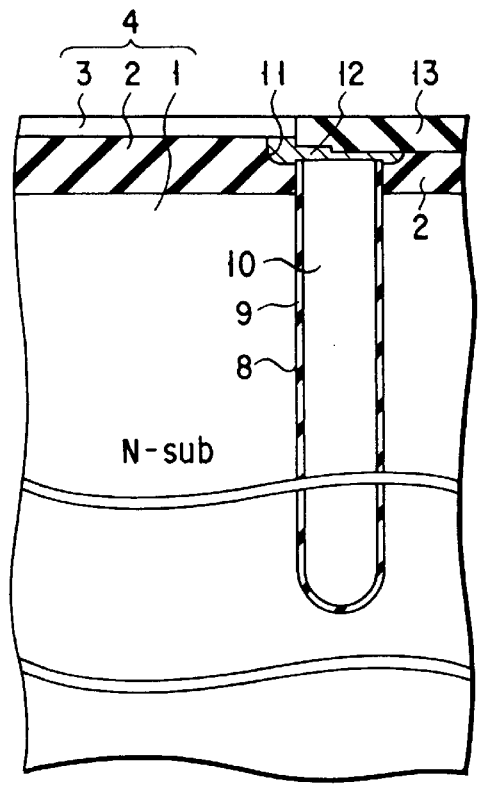
F I G. 8
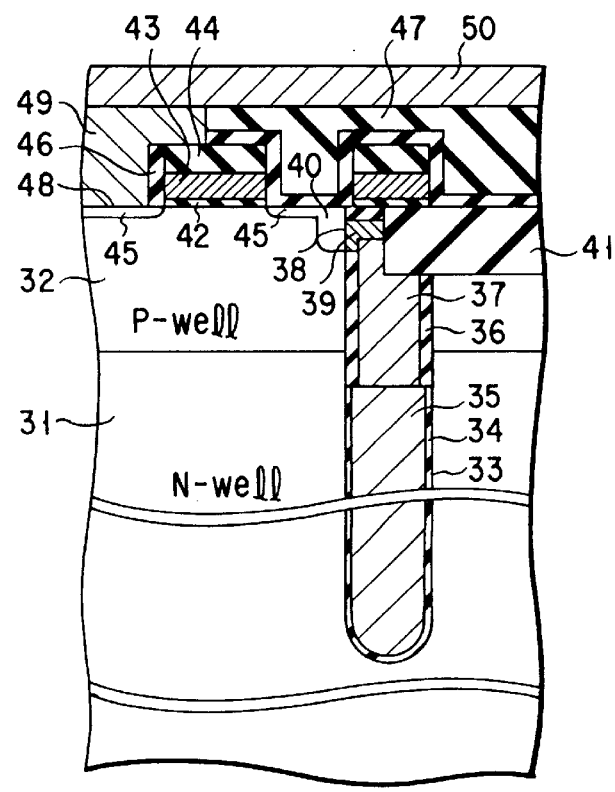
F I G. 9

SEMICONDUCTOR MEMORY DEVICE AND FABRICATING METHOD

This application is a continuation of application Ser. No. 08/678,709, filed Jul. 11, 1996, now abandoned.

BACKGROUND OF THE INVENTION

1. Field of the Invention

The present invention relates to a semiconductor memory device and a method of fabricating the same, or more particularly to a high-integration DRAM using an SOI (Silicon-On-Insulator) substrate and a method of fabricating the same.

2. Description of the Related Art

Examples of conventional high-integration DRAMs are BEST (BuriEd STrap) cells disclosed in L. Nesbit et al., "A 0.6 $\mu m^2$ 256Mb Trench DRAM Cell With Self-Aligned BuriEd STrap", 1993 IEDM Technical Digest, pp. 627–630, 1993 and G. Bronner et al., "A Fully Planarized 0.25 $\mu m$ CMOS. Technology for 256 Mbit DRAM and Beyond", 1995 Symposium on VLSI Technology Digest of Technical Papers, pp. 15–16, 1995.

A BEST cell will be described with reference to FIG. 9. A MOSFET having a gate oxide film 42, a gate electrode 43 formed of a superposed film of WSi film/polysilicon film, and source/drain diffusion layers 45 is formed on a P-Well 32 which in turn is formed on a semiconductor substrate. A trench 33 is formed in the vicinity of the MOSFET. A capacitor formed of a buried N-Well 31, an ON film 34 and a polysilicon film 35 is formed in the lower portion of the trench. The ON film includes a SiN film formed on the inner wall of the trench and an oxide film formed of an oxidated surface of the SiN film. An oxide film collar 36 is formed along the inner wall at the middle portion of the trench, and a polysilicon film 37 is formed in the middle portion of the trench. One of the source/drain diffusion layers 45 of the MOSFET is connected to a buried strap (Impurities Diffusion Layer) 40, and further to a polysilicon film 39 through a sidewall contact 38 formed in the upper portion of the trench. The polysilicon films 39, 37, 35 are interconnected and are filled in the trench. A STI (Shallow Trench Isolation) 41 constituting a device-isolating region is formed in the substrate, at one side of the upper portion of the trench, which side is opposite to the other side where the buried strap 40 is formed. A SiN film 44 is formed above the gate electrode 43, and a sidewall spacer 46 is formed on the sidewall of the gate electrode 43 and the SiN film 44. A flattened interlayer BPSG film 47 is formed on the sidewall spacer 46. Also, a SAC (Self-Aligned Contact) 48 is opened to the gate electrode 43 on the other layer of the source/drain diffusion layers 45 of the MOSFET. This SAC 48 is filled with a polysilicon plug 49. A bit wire 50 connected with the polysilicon plug 49 is formed on the interlayer BPSG film 47.

In fabricating the BEST cell, the buried N-Well 31 is formed on an N-semiconductor substrate, and then the trench 33 is formed. The ON film 34 is formed on the inner wall of the trench, by depositing a nitride film on the inner wall of the trench and then oxidating the surface of the nitride film. The polysilicon film 35 is filled in the lower-portion of the trench. The polysilicon film 35 is etched back to the middle portion of the trench, and then the oxide film collar 36 is formed along the inner wall of the trench. The middle portion of the trench is filled again with the polysilicon film 37, and the polysilicon film 37 thus filled is etched back to a predetermined depth, thereby exposing a portion of the oxide film collar 36. The oxide film collar 36 thus exposed is etched off, thereby forming a sidewall contact 38. As the next step, a polysilicon film 39 is buried in the upper portion of the trench, followed by etching back the polysilicon film 39 to the substrate surface. After that, the N-impurities contained in the polysilicon film 39 are diffused into a P-well 32 by heat treatment thereby to form a buried strap 40. Then, a mask layer (not shown) is formed at a predetermined position, and using this mask layer, a predetermined portion of the semiconductor substrate is removed. An STI 41 is formed in this portion left after removal. The P-Well 32 is formed by an ion implantation process. Then, an oxide film layer, a conductive layer and an SiN layer are sequentially formed, and by patterning these layers, the gate oxide film 42, the gate electrode 43 and the SiN film 44 are formed, respectively. With these deposited films as a mask, impurities are implanted in the P-well 32 thereby to form N-type source/drain diffusion layers 45 in the P-well 32. As the next step, the sidewall spacer 46 is formed on the sidewall of the gate electrode, followed by forming the interlayer BPSG film 47 on the sidewall spacer 46 and flattening the BPSG film 47. The SAC 48 is opened to the gate electrode 43 at a portion of the BPSG film 47 corresponding to one of the source/drain diffusion layers, and then the SAC 48 is filled with the polysilicon plug 49. Then, the bit wire 50 connected with the polysilicon plug 49 is formed on the interlayer BPSG film 47.

The above-mentioned conventional BEST cell poses the following problems.

First, in order to secure a sufficiently large capacitance, a deep trench or a thin ON film is required. The effort to increase the aspect ratio of the trench and reduce the thickness of the ON film, however, has almost reached a technical limit, and a further integration is considerably difficult.

Secondly, the use of a MOSFET formed on a bulk silicon layer increases the junction capacity between the source/drain diffusion layers and the substrate, making it impossible to increase the operation speed.

Thirdly, the configuration of a MOSFET formed on a bulk silicon layer cannot reduce power consumption.

Fourthly, the depth of the STI 41 is required to be larger than the sidewall contact 38, which demands a higher controllability and prevents a high-yield production of cells.

Fifthly, the formation of the oxide film collar and the sidewall contact requires complicated processes, and the trench must be buried with a polysilicon film three times, resulting in an increased fabrication cost.

SUMMARY OF THE INVENTION

In view of the above-mentioned problems, the object of the present invention is to provide a semiconductor memory device of low power consumption capable of high integration and speed, and a method of fabricating a semiconductor memory device with low cost and high yield.

In order to solve the above-mentioned problems, according to one aspect of the invention, there is provided a semiconductor memory device comprising an SOI substrate, a MOS transistor formed on the SOI substrate, a trench formed in a portion of the SOI substrate in the vicinity of the MOS transistor, and a conductive film buried in an insulating layer of the SOI substrate, being in contact with the trench.

The conductive film is preferably in contact with a bottom surface of one of the source/drain regions of the MOS transistor.

More specifically, according to this aspect of the invention, there is provided a semiconductor memory device comprising a semiconductor substrate including a first semiconductor layer, an insulating layer formed on the first semiconductor layer and a second semiconductor layer formed on the insulating layer, a MOS transistor formed on the second semiconductor layer of the semiconductor substrate, a trench located in the vicinity of the MOS transistor and reaching the first semiconductor layer through the second semiconductor layer and the insulating layer, a first conductive material filled in the trench, and a second conductive material formed in an etched portion of the insulating layer, which portion is in an upper portion of the insulating layer and in the visinity of the trench, the second conductive material for connecting the first conductive material to one of the source/drain electrodes of the MOS transistor.

In this aspect of the invention, the second conductive material is in contact with the insulating layer side of the selected one of the electrodes of the MOS transistor.

According to another aspect of the invention, there is provided a method of fabricating a semiconductor memory device having the above-mentioned structure, comprising the steps of forming a trench in an SOI substrate, etching a portion of an insulating layer of the SOI substrate from the inside of the trench, and filling a conductive film in the etched portion.

More specifically, according to this aspect of the invention, there is provided a method of fabricating a semiconductor memory device, comprising the steps of forming a trench in a semiconductor substrate including a first semiconductor layer, a first insulating layer formed on the first semiconductor layer and a second semiconductor layer formed on the first insulating layer, the trench reaching the first semiconductor layer through the second semiconductor layer and the first insulating layer, forming a second insulating layer in the trench, filling the trench with a first conductive film up to the vicinity of the first insulating layer, etching an upper portion of the first insulating layer from the inside of the trench, which portion is in the visinity of the trench filling the trench and the etched portion with a second conductive film, and forming on the second semiconductor layer a MOS transistor having one of the source/drain electrodes, which one electrode is in contact with the second conductive film.

Preferably, this method further comprises a step of forming a device-isolating insulating film covering at least a portion of the trench between the step of filling the second conductive film and the step of forming the MOS transistor.

Further, the device-isolating insulating film is formed by etching the second semiconductor layer and the second conductive film, thus forming a device-isolating trench, and filling a third insulating film in the device-isolating trench.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 is a sectional view showing a semiconductor structure in one of the steps of fabricating a semiconductor memory device according to the first embodiment of the invention;

FIG. 8 is a sectional view showing a semiconductor memory device according to a second embodiment of the invention; and FIG. 9 is a sectional view of a conventional semiconductor memory device.

DETAILED DESCRIPTION OF THE PREFERRED EMBODIMENTS

Embodiments of the invention will be described with reference to FIGS. 1 to 8.

Figure 1:
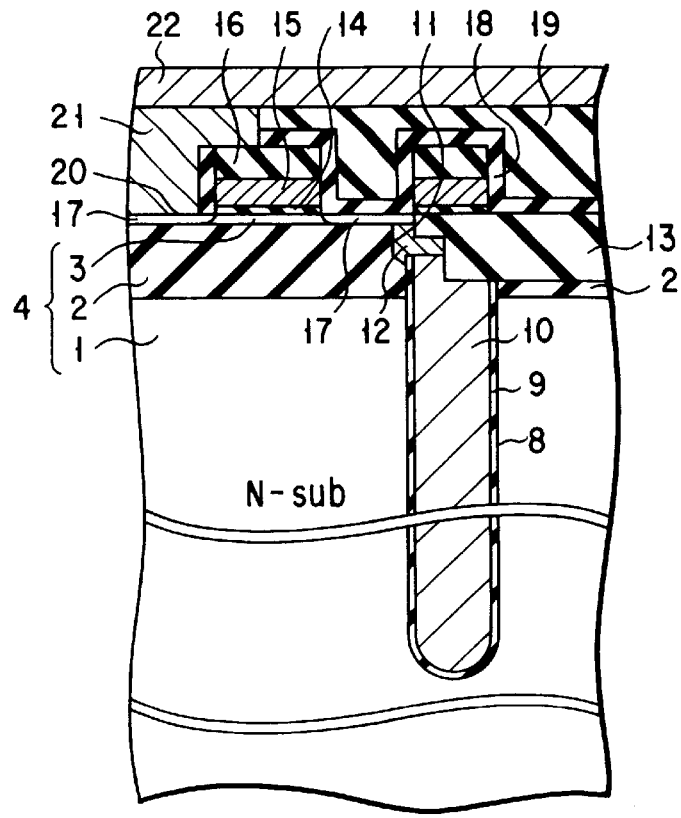
FIG. 1 is a sectional view showing a semiconductor memory device according to a first embodiment of the invention.

A sectional view of a semiconductor memory device according to the invention is shown in FIG. 1. A memory cell according to the invention is formed on an SOI (Silicon-On-Insulator) substrate 4 including an N-type single crystal silicon substrate 1, a silicon oxide film 2 formed on the substrate 1, a P-type single crystal silicon film 3 formed on the silicon oxide film 2. A MOSFET having a gate oxide film 14, a gate electrode 15 constituted of a superposed film of WSi film/polysilicon film and source/drain diffusion layers 17 is formed on the semiconductor film 3. A trench 8 projected through the silicon oxide film 2, i.e., the buried oxide film 2 into the semiconductor substrate 1 is formed in the vicinity of the MOSFET. A capacitor is formed in the trench, which is constituted of an ON film formed along the inner wall of the trench and a polysilicon film 10 formed in the trench. The ON film 9 includes an SiN film formed along the inner wall of the trench and an oxide film formed by oxidating the surface of the SiN film. An undercut 11 is formed by etching an upper portion of the buried oxide film 2 from the inside of the trench, which upper portion is in the vicinity of an upper portion of the trench. The undercut 11 is filled with a polysilicon film 12. The upper surface of this polysilicon film 12 is connected to the bottom surface of one of the source/drain diffusion layers 17 of the MOSFET (i.e., the surface thereof facing the buried oxide film 2). An STI (Shallow Trench Isolation) 13 constituting a device-isolating region is formed in the substrate, at one side of the upper portion of the trench, which side is opposite to the other side where the source/drain diffusion layers 17 are formed in the upper portion of the trench. An SiN film 16 is formed on the gate electrode 15, and a sidewall spacer 18 made of an SiN film is formed on the sidewall of the gate electrode 15. A flattened interlayer BPSG film 19 is formed on the sidewall spacer 18. Also, a SAC (Self-Aligned Contact) 20 is opened, in alignment with the gate electrode 15, onto the other one of the source/drain diffusion layers 17 of the MOSFET. The SAC 20 is filled with a polysilicon plug 21. A bit wire 22 connected to the polysilicon plug 21 is formed on the interlayer BPSG film 19.

The above-mentioned configuration has the following advantages described below.

1) Since a trench capacitor is formed on a SOI substrate, a smaller capacitance suffices. Hence, the need of a deep trench or a thin ON film is eliminated. The strict controllability conventionally required for forming these component parts is thus not required, thereby further simplifying the fabrication processes and making possible higher integration.

2) The use of a MOSFET on a SOI substrate can reduce the junction capacity between the source/drain diffusion layers and the substrate, thus permitting a higher speed.

3) The use of a MOSFET on a SOI substrate can also improve power consumption.

4) Further, the unnecessity of the steps of forming an oxide film collar and a sidewall contact and the requirement of only two steps of burying the trench with a polysilicon film reduce the production cost.

Now, a method of fabricating the semiconductor memory device according to the invention, as shown in FIG. 1, will be described with reference to FIGS. 2 to 7.

Figure 2:
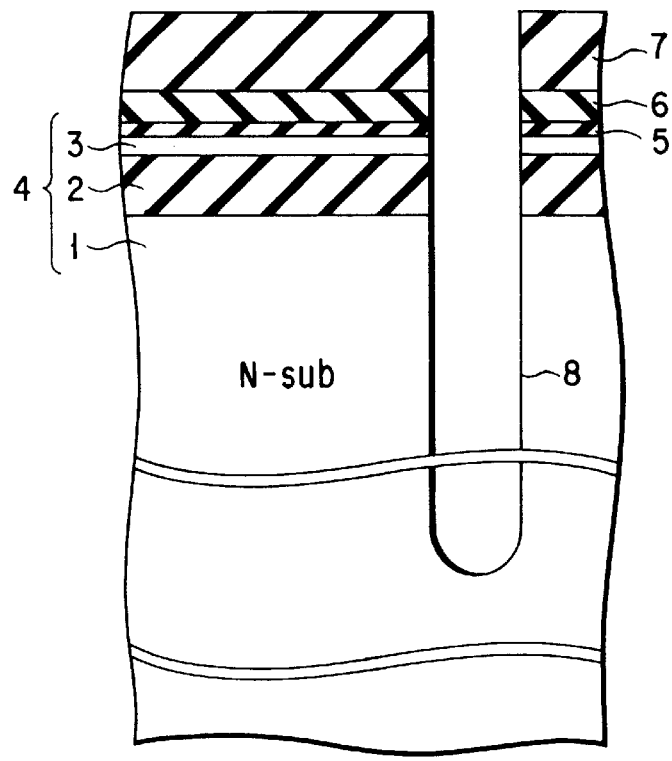
FIG. 2 is a sectional view showing a semiconductor structure in one of the steps of fabricating a semiconductor memory device according to the first embodiment of the invention.

First, as shown in FIG. 2, a SiO$_2$ film 5, a SiN film 6 and a SiO$_2$ film 7 are sequentially formed on a SOI (Silicon-On-Insulator) substrate 4 including a semiconductor substrate 1, a buried silicon oxide film 2 and a semiconductor film 3. A photoresist (not shown) is coated, and the resulting photoresist layer is patterned to form a photoresist pattern. With this photoresist pattern as a mask, a trench 8 extending from the SiO$_2$ film 7 to the semiconductor substrate 1 is formed by photolithography and RIE (Reactive Ion Etching) process.

Figure 3:
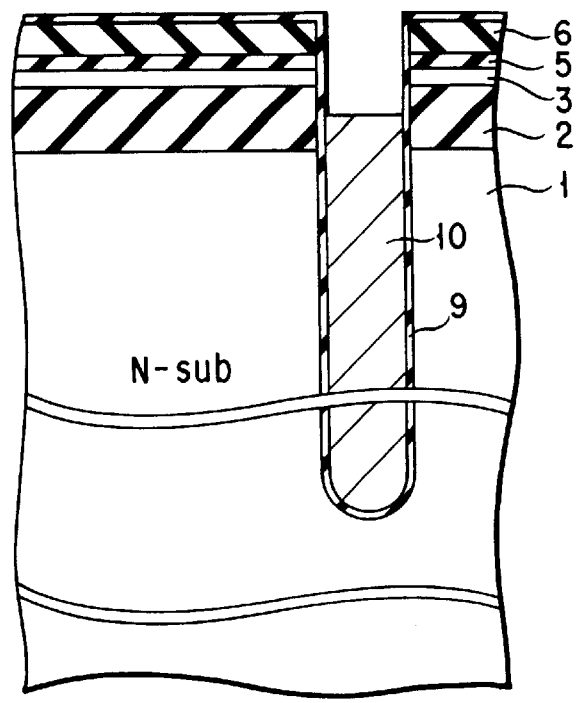
FIG. 3 is a sectional view showing a semiconductor structure in one of the steps of fabricating a semiconductor memory device according to the first embodiment of the invention.

Then, the SiO$_2$ film 7 is removed. Thereafter a thin SiN film is deposited over the entire surface, followed by oxidating the surface of the SiN film. An ON film 9 thus is formed as shown in FIG. 3. A polysilicon film is deposited over the entire surface, thus completely burying the trench 8 with the polysilicon film. As the next step, the polysilicon film is etched back to the middle portion of the buried oxide film 2 by CMP (Chemical Mechanical Polish) or RIE process so that a polysilicon film 10 is formed as shown in FIG. 3.

Figure 4:
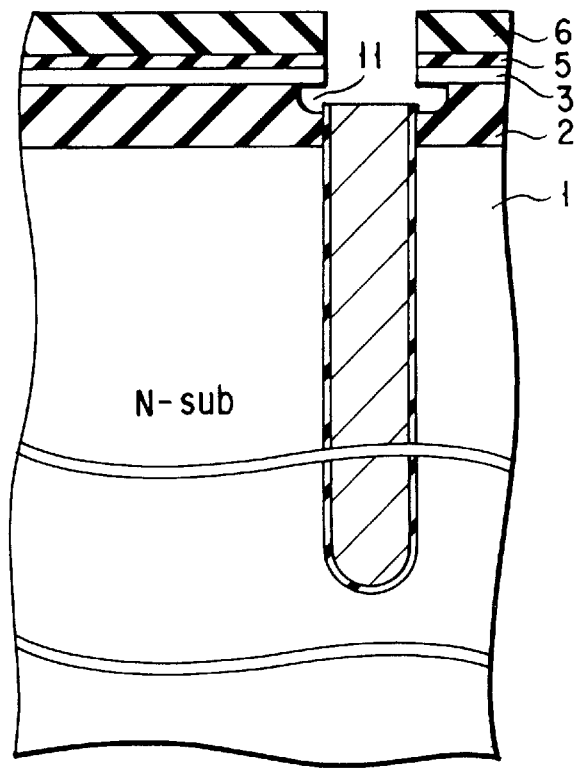
FIG. 4 is a sectional view showing a semiconductor structure in one of the steps of fabricating a semiconductor memory device according to the first embodiment of the invention.

A portion of the ON film 9 which is exposed to the inner wall of the trench is removed by the etch-back process for forming the polysilicon film 10. Then the portion of the buried oxide film 2 that is exposed by the etching off of the particular portion of the ON film 9 is etched off. As a result, an etched-off portion of the buried oxide film 2 is formed in the upper portion of the trench as shown in FIG. 4.

Figure 5:
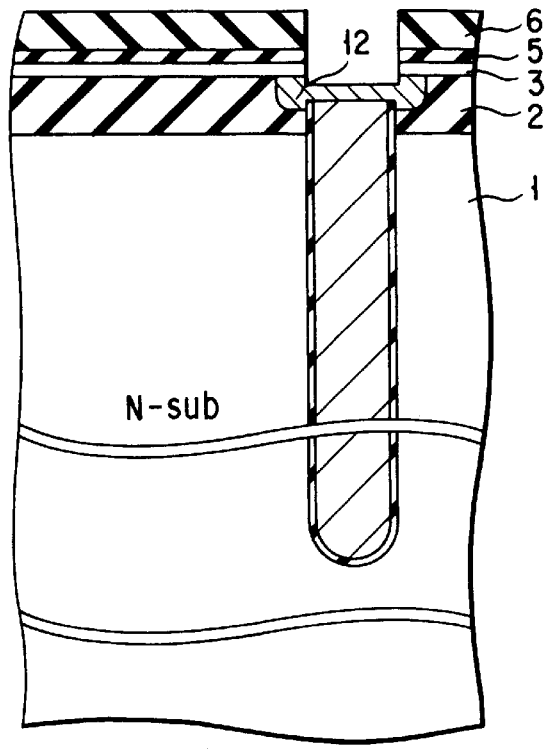
FIG. 5 is a sectional view showing a semiconductor structure in one of the steps of fabricating a semiconductor memory device according to the first embodiment of the invention.

As the next step, as shown in FIG. 5, a polysilicon film is deposited again and etched back, thereby forming a buried polysilicon film 12 in the etched-off portion 11. The semiconductor film 3 and the polysilicon film 12 are connected by way of the bottom surface of the semiconductor film 3 and the upper surface of the polysilicon film 12.

Figure 6:
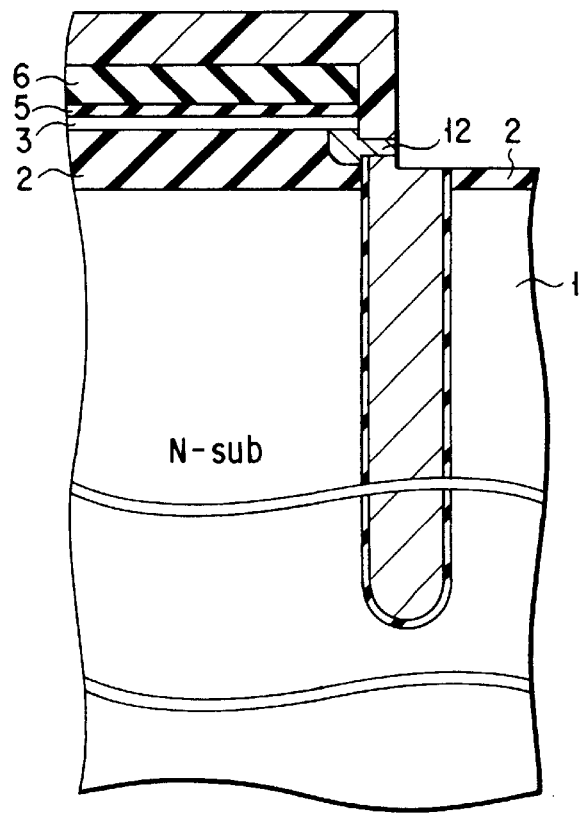
FIG. 6 is a sectional view showing a semiconductor structure in one of the steps of fabricating a semiconductor memory device according to the first embodiment of the invention.

As shown in FIG. 6, a resist pattern is formed in a predetermined region. With this resist pattern as a mask, a predetermined portion of the SiO$_2$ film 5 and the SiN film 6, a predetermined portion of the polysilicon layers 10, 12 and a predetermined portion of the oxide film 2 are etched off. Then, as shown in FIG. 7, the resist pattern is removed. Thereafter an oxide film is formed over the entire surface and then flattened until the remaining portions of the SiO$_2$ film 5 and the SiN film 6 are removed to expose the silicon film 3 and to form an STI 13 in the etched-off portion. As shown in FIG. 1, a gate oxide film 14 is formed on the semiconductor film 3. Thereafter a gate electrode 15 including WSi film/polysilicon film and a SiN film 16 are sequentially formed on the gate oxide film 14. By using these films thus deposited as a mask, source/drain diffusion layers 17 are formed by self-alignment with the deposited films. A sidewall spacer 18 including an SiN film is formed on the sidewall of the deposited films. An interlayer BPSG film 19, a SAC 20, a polysilicon plug 21 and a bit wire 22 are formed in that order by a well-known method.

The foregoing embodiment refers to the case in which the depth of the undercut 11 is smaller than that of the STI 13. The reverse may be the case. A modification of the embodiment is shown in FIG. 8. This modification refers to the case in which the depth of the undercut 11 is larger than that of the STI 13. The other parts and the fabrication steps are similar to the corresponding ones in the foregoing embodiment and therefore will not be described.

A method of fabricating a semiconductor memory device according to the invention is described above. By observing these steps of fabrication, the following advantage is further obtained in addition to the advantages obtained by the first embodiment.

Since the depth of the STI 13 may be larger or smaller than that of the undercut 11 as desired, a strict controllability is not required leading to a high yield.

According to the invention, a trench capacitor is formed on an SOI substrate, and therefore a small capacitance of the capacitor suffices. As a consequence, a deep trench or a thin ON film is not required, thereby making it possible to improve the integration. Also, the use of a MOSFET formed on an SOI substrate can reduce the junction capacity between the source/drain diffusion layers and the substrate for an improved speed. The use of such a MOSFET formed on a SOI substrate also reduces power consumption. Furthermore, the depth of the STI 13 may be either larger (FIG. 1) or smaller (FIG. 8) than that of the undercut 11, so that a strict controllability is not demanded. A high yield of the semiconductor device thus is obtained. What is more, the absence of the steps of forming an oxide film collar and a sidewall contact and the use of only two steps of burying the trench with a polysilicon film reduces the fabrication cost.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   an SOI substrate formed on a first silicon layer, said SOI substrate including an insulating layer formed on said first silicon layer and a second silicon layer formed on said insulating layer;

a shallow trench isolation structure formed in said SOI substrate, wherein said shallow trench isolation structure extends through said second silicon layer and into said insulating layer of said SOI substrate to thereby define an isolated active area of said second silicon layer;

a MOS transistor formed on said active area;

a trench formed in the vicinity of said MOS transistor, said trench extending through said SOI substrate and into said first silicon layer; and a conductive film buried in said insulating layer of said SOI substrate, said conductive film being in contact with said trench, said conductive film extending toward said MOS transistor from said trench beyond a side portion of said trench and being in contact with a bottom surface of one of source/drain electrodes of said MOS transistor.

2. A semiconductor memory device comprising:

a substrate formed on first semiconductor layer, said substrate comprising an insulating layer formed on said first semiconductor layer and a second semiconductor layer formed on said insulating layer;

a shallow trench isolation structure formed in said substrate, wherein said shallow trench isolation structure extends through said second semiconductor layer and into said insulating layer of said substrate to thereby define an isolated active area of said second semiconductor layer;

a MOS transistor formed on said active area;

a trench located in the vicinity of said MOS transistor and reaching said first semiconductor layer through said second semiconductor layer and said insulating layer;

a first conductive material filling in said trench; and a second conductive material formed in an etched portion of said insulating layer, which portion is in an upper portion of said insulating layer and in the vicinity of the trench, said second conductive material extending toward said MOS transistor from said trench beyond a side portion of said trench and being in contact with a bottom surface of one of source/drain electrodes of said MOS transistor and with said first conductive material.

3. A semiconductor memory device, comprising:

a substrate formed on a first semiconductor layer, said substrate comprising an insulating layer formed on said first semiconductor layer, and a second semiconductor layer formed on said insulating layer;

a shallow trench isolation structure formed in said substrate, wherein said shallow trench isolation structure extends through said second semiconductor layer and into said insulating layer of said substrate to thereby define an isolated active area of said second semiconductor layer; and a memory cell formed on said substrate, said memory cell comprising:

a MOS transistor formed on said active area and comprising spaced apart source and drain regions formed in said second semiconductor layer and a gate electrode insulated from a channel region between said source and drain regions;

a trench capacitor formed in a trench extending through said substrate and into said first semiconductor layer;

an opening formed in a portion of the sidewall of said trench defined by said insulating layer, said opening extending outwardly from said trench to be under one of said source and drain regions of said MOS transistor; and a conductive material formed in said opening for electrically connecting said trench capacitor and said one of said source and drain regions.

4. The semiconductor memory device according to claim 3, wherein said insulating layer comprises a silicon dioxide layer.

5. The semiconductor memory device according to claim 3, wherein said conductive material connects an upper surface of said trench capacitor to a bottom surface of said one of said source and drain regions.

6. The semiconductor memory device according to claim 3, wherein said conductive material comprises polysilicon.

7. The semiconductor memory device according to claim 3, further comprising a shallow trench isolation structure for isolating said memory cell from other memory cells formed on said substrate.

8. A semiconductor memory device comprising:

a substrate formed on a first semiconductor layer, said substrate comprising an insulating layer formed on said first semiconductor layer, and a second semiconductor layer formed on said insulating layer;

a memory cell formed on said substrate; and a shallow trench isolation structure for isolating said memory cell from other memory cells formed on said substrate, said shallow trench isolation structure extending through said second semiconductor layer and into said insulating layer of said substrate to thereby define an isolated active area of said second semiconductor layer said memory cell comprising:

a MOS transistor comprising spaced apart source and drain regions formed in said second semiconductor layer and a gate electrode insulated from a channel region between said source and drain regions;

a trench capacitor formed in a trench extending through said substrate and into said first semiconductor layer;

an opening formed in a portion of the sidewall of said trench defined by said insulating layer, said opening extending outwardly from said trench to be under one of said source and drain regions of said MOS transistor; and a conductive material formed in said opening for electrically connecting said trench capacitor and said one of said source and drain regions, wherein a depth of a trench of said shallow trench isolation structure beneath the surface of said substrate is greater than a depth of said opening beneath the surface of said substrate.

9. A semiconductor memory device, comprising:

a substrate formed on a first semiconductor layer, said substrate comprising an insulating layer formed on said first semiconductor layer, and a second semiconductor layer formed on said insulating layer;

a shallow trench isolation structure formed in said substrate, wherein said shallow trench isolation structure and said insulating layer of said substrate define an active area of said second semiconductor layer;

a memory cell formed on said substrate, said memory cell comprising:

a MOS transistor formed on said active area and comprising spaced apart source and drain regions formed in said second semiconductor layer and a gate electrode insulated from a channel region between said source and drain region; and a trench capacitor formed in a trench extending through said substrate and into said first semiconductor layer;

an opening formed in a portion of the sidewall of said trench defined by said insulating layer, said opening extending outwardly from said trench to be under one of said source and drain regions of said MOS transistor; and a conductive material formed in said opening for electrically connecting said trench capacitor and said one of said source and drain regions, wherein a depth of a trench of said shallow trench isolation structure beneath the surface of said substrate is less than a depth of said opening beneath the surface of said substrate.

10. A semiconductor memory device comprising:

a first semiconductor layer;

an insulating layer formed on a surface of said first semiconductor layer;

a second semiconductor layer formed on a surface of said insulating layer;

a shallow trench isolation structure which extends through said second semiconductor layer at least to the surface of said insulating layer on which said second semiconductor layer is formed, to thereby define an isolated active area of said second semiconductor layer; and a memory cell comprising:

a MOS transistor formed on said active area and comprising spaced apart source and drain regions formed in said second semiconductor layer and a gate electrode insulated from a channel region between said source and drain regions; and a trench capacitor formed in a trench extending through said second semiconductor layer and said insulating layer and into said first semiconductor layer, said trench capacitor electrically connected to said MOS transistor, said trench capacitor comprising a dielectric layer having a uniform thickness formed on walls of said trench and a conductive layer formed on said dielectric layer;

an opening extending outwardly from said trench in which said trench capacitor is formed to be under one of said source and drain regions of said MOS transistor; and a conductive material formed in said opening for providing the electrical connection between said trench capacitor and said MOS transistor.

11. A semiconductor memory device comprising:

a semiconductor layer;

an insulating layer formed on a surface of said semiconductor layer;

an active area of an island shape formed on a surface of said insulating layer;

a memory cell comprising:
  a MOS transistor formed on said active area and comprising spaced apart source and drain regions formed in said active area and a gate electrode insulated from a channel region between said source and drain regions; and
  a trench capacitor formed in a trench extending through said active area and said insulating layer and into said semiconductor layer, said trench capacitor comprising a dielectric layer formed on an inner surface of a portion of said trench which is formed in said semiconductor layer and a conductive layer formed on said dielectric layer;

an opening extending outwardly from said trench in which said trench capacitor is formed to be under one of said source and drain regions of said MOS transistor; and a conductive material formed in said opening for providing the electrical connection between said trench capacitor and said MOS transistor, wherein said active area is physically isolated from all other active areas.

12. A semiconductor memory device comprising:

a semiconductor layer;

an insulating layer formed on a surface of said semiconductor layer;

an active area of an island shape formed on a surface of said insulating layer;

a memory cell comprising:
  a MOS transistor formed on said active area and comprising spaced apart source and drain regions formed in said active area and a gate electrode insulated from a channel region between said source and drain regions; and
  a trench capacitor formed in a trench extending through said active area and said insulating layer and into said semiconductor layer;

an opening extending outwardly from said trench in which said trench capacitor is formed to be under one of said source and drain regions of said MOS transistor; and a conductive material formed in said opening for providing the electrical connection between said trench capacitor and said MOS transistor, wherein said active area is physically isolated from all other active areas.

13. A semiconductor memory device comprising:

a semiconductor layer;

an insulating layer formed on a surface of said semiconductor layer;

an active area of an island shape formed on a surface of said insulating layer and physically isolated from a surrounding thereof;

a memory cell comprising:
  a MOS transistor formed on said active area and comprising spaced apart source and drain regions formed in said active area and a gate electrode insulated from a channel region between said source and drain regions; and
  a trench capacitor formed in a trench extending through said active area and said insulating layer and into said semiconductor layer, said trench capacitor comprising a dielectric layer formed on an inner surface of a portion of said trench which is formed in said semiconductor layer and a conductive layer formed on said dielectric layer;

an opening extending outwardly from said trench in which said trench capacitor is formed to be under one of said source and drain regions of said MOS transistor; and a conductive material formed in said opening for providing the electrical connection between said trench capacitor and said MOS transistor.

14. A semiconductor memory device comprising:

a semiconductor layer;

an insulating layer formed on a surface of said semiconductor layer;

an active area of an island shape formed on a surface of said insulating layer and physically isolated from a surrounding thereof;

a memory cell comprising:

a MOS transistor formed on said active area and comprising spaced apart source and drain regions formed in said active area and a gate electrode insulated from a channel region between said source and drain regions; and a trench capacitor formed in a trench extending through said active area and said insulating layer and into said semiconductor layer;

an opening extending outwardly from said trench in which said trench capacitor is formed to be under one of said source and drain regions of said MOS transistor; and a conductive material formed in said opening for providing the electrical connection between said trench capacitor and said MOS transistor.

* * * * *